(12) United States Patent
Mueller

(10) Patent No.: US 8,493,084 B2
(45) Date of Patent: Jul. 23, 2013

(54) APPARATUS AND METHOD FOR ACTIVE VOLTAGE COMPENSATION OF ELECTROSTATIC DISCHARGE OF A SUBSTRATE

(75) Inventor: Bernhard Mueller, Finsing (DE)

(73) Assignee: Applied Materials, Inc., Santa Clara, CA (US)

( * ) Notice: Subject to any disclaimer, the term of this patent is extended or adjusted under 35 U.S.C. 154(b) by 620 days.

(21) Appl. No.: 12/582,909

(22) Filed: Oct. 21, 2009

(65) Prior Publication Data

US 2010/0097086 A1    Apr. 22, 2010

(30) Foreign Application Priority Data

Oct. 21, 2008 (EP) ..................................... 08167188

(51) Int. Cl.
*G01R 31/20* (2006.01)
*G01R 31/02* (2006.01)

(52) U.S. Cl.
USPC .................................. 324/754.01; 324/762.01

(58) Field of Classification Search
None
See application file for complete search history.

(56) References Cited

U.S. PATENT DOCUMENTS

| | | | |
|---|---|---|---|
| 5,376,882 A | 12/1994 | Johnson | |
| 5,432,454 A * | 7/1995 | Durkin | 324/452 |
| 5,703,487 A * | 12/1997 | Mishra | 324/456 |
| 5,886,528 A * | 3/1999 | Perry | 324/457 |
| 6,075,245 A | 6/2000 | Toro-Lira | |
| 6,107,804 A * | 8/2000 | Suzuki et al. | 324/457 |
| 6,552,555 B1 | 4/2003 | Nuytkens et al. | |
| 7,262,624 B2 * | 8/2007 | Miller | 324/754.07 |
| 7,307,434 B2 * | 12/2007 | Watanabe | 324/754.07 |
| 7,535,238 B2 * | 5/2009 | Abboud et al. | 324/754.23 |
| 7,746,088 B2 * | 6/2010 | Abboud et al. | 324/754.22 |
| 2003/0160626 A1 | 8/2003 | Maruyama et al. | |
| 2007/0046621 A1 | 3/2007 | Suwabe et al. | |
| 2008/0169822 A1 | 7/2008 | Kwak | |

FOREIGN PATENT DOCUMENTS

| | | |
|---|---|---|
| JP | 2001-217301 | 8/2001 |
| JP | 2002-368059 | 12/2002 |
| WO | WO-2007/005211 A2 | 1/2007 |

OTHER PUBLICATIONS

International search report for PCT/IB/2009/007180 dated Jun. 28, 2010.

Written opinion for PCT/IB2009/007180 dated Jun. 28, 2010.

* cited by examiner

*Primary Examiner* — Vinh Nguyen

(74) *Attorney, Agent, or Firm* — Patterson & Sheridan, LLP

(57) ABSTRACT

A voltage compensation assembly adapted for apparatus having a prober for contacting the electronic elements on a substrate is described. The voltage compensation assembly includes a controller connected to the prober and adapted for active voltage compensation, and a voltage measuring unit connected to the controller and for measuring a voltage on the substrate.

5 Claims, 6 Drawing Sheets

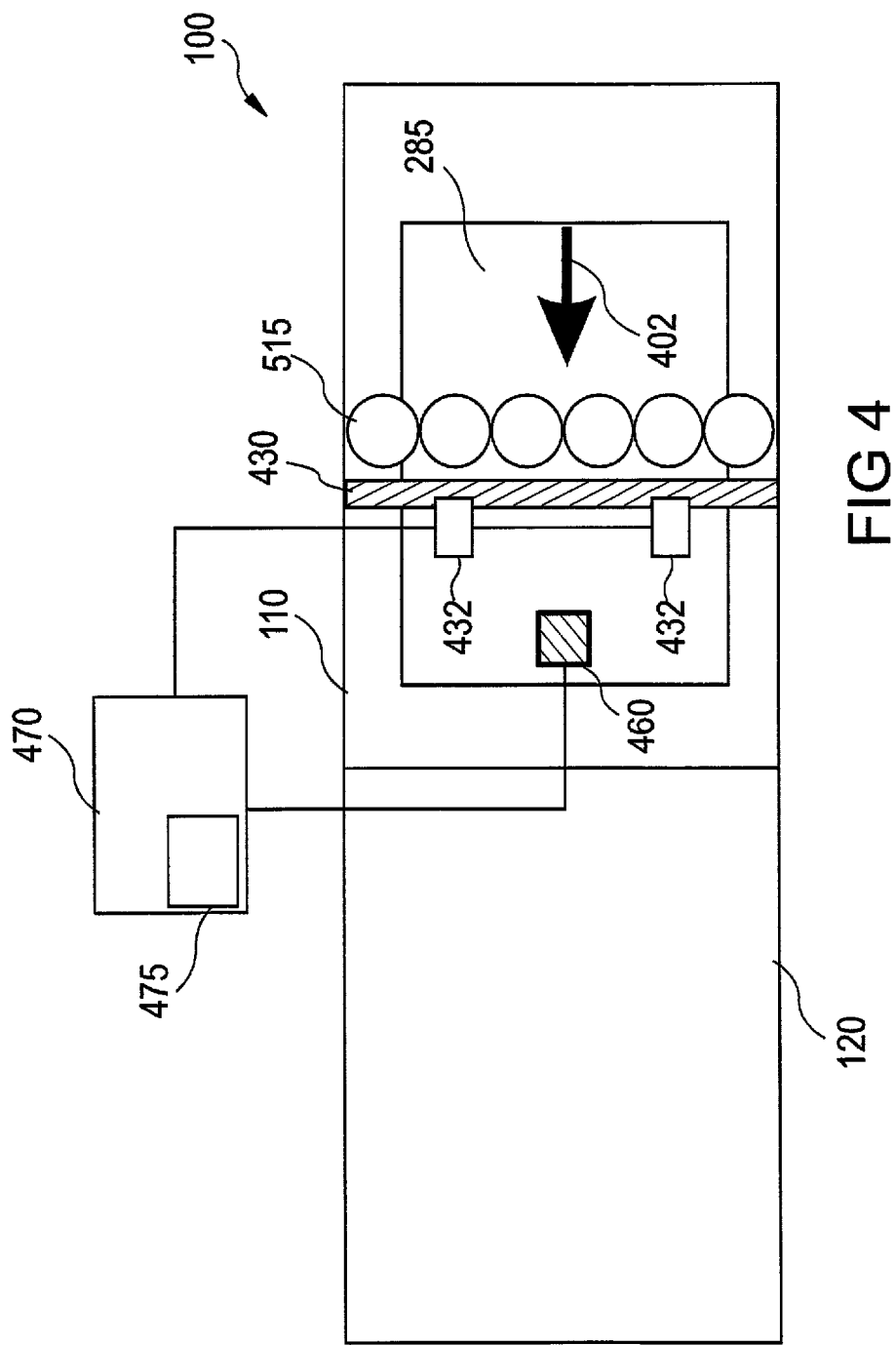

APPARATUS AND METHOD FOR ACTIVE VOLTAGE COMPENSATION OF ELECTROSTATIC DISCHARGE OF A SUBSTRATE

BACKGROUND OF THE INVENTION

1. Field of the Invention

Embodiments of the present invention generally relate to a test system for substrates and a method of testing substrates, in particular to test systems for glass substrates and a method of testing electronic structures on glass substrates. More particularly, the invention relates to an integrated testing system for large area substrates in the production of flat panel displays. Specifically, they relate to a voltage compensation assembly, an apparatus for testing electronic devices on a substrate, a method for active voltage compensation, and a method for testing a plurality of electronic devices on a large area substrate 2. Description of the Related Art Flat panel displays have recently become more and more common and are widely used as a replacement for the cathode ray tubes displays. Generally, different types of flat panel displays can be used. For example, active matrix liquid crystal displays (LCD's) are one type of displays. Further, displays including OLEDs or plasma displays may also be used. An LCD, OLED display or plasma display has several advantages over the CRT, including higher picture quality, lighter weight, lower voltage requirements, and low power consumption. The displays have many applications in computer monitors, cell phones, televisions and the like.

Generally, electronic control of pixel elements on a substrate is provided for LCDs, OLEDs or Plasma displays. For example, an active matrix LCD includes a liquid crystal material sandwiched between a thin film transistor (TFT) array substrate and a color filter substrate to form a flat panel display. The TFT substrate includes an array of thin film transistors, each coupled to a pixel electrode and the color filter substrate includes different color filter portions and a common electrode. When a certain voltage is applied to a pixel electrode, an electric field is created between the pixel electrode and the common electrode, orienting the liquid crystal material to allow light to pass therethrough for that particular pixel.

During manufacturing of displays testing of the flat panel substrate is required to determine the operability of the individual pixels. Voltage imaging, charge sensing, and electron beam testing are some processes used to monitor and troubleshoot defects during the manufacturing process. For example, during electron beam testing, the response of a pixel is monitored to provide defect information. In one example of electron beam testing, certain voltages are applied to the pixel electrodes, and an electron beam may be directed to the individual pixel electrodes under investigation. Secondary electrons emitted from the pixel electrode area are sensed to determine the electrode voltages. Other testing procedures might be provided for LCD displays, such as TFTs, OLED displays and plasma displays. Generally, for testing procedure, a substrate carrying the display or a portion of the display is disposed in or on a testing apparatus.

The size of the processing equipment as well as the throughput is a great concern to flat panel display manufacturers, both from a financial standpoint and a design standpoint. Thereby, flat panel displays or substrates for flat panel displays and other large area electronic equipment have to be carefully treated in order to not decrease the yield of the manufacturing process. Current flat panel display processing equipment of generation 8.5 (G 8.5) generally accommodates large area substrates up to about 2200 mm by 2500 mm and larger. The demand for larger displays, increased production and lower manufacturing costs has created a need for improved testing systems that can improve the yield of substrates found to meet the production criteria.

Therefore, there is a need for a test system to perform testing on large area substrates and methods for testing of large area substrates whereby an improved substrate treatment can be provided.

SUMMARY OF THE INVENTION

In light of the above, a method for active voltage compensation according to independent claim 1 is provided.

According to one embodiment, a voltage compensation assembly adapted for system having a prober for contacting the electronic elements on a substrate is provided. The voltage compensation assembly includes: a controller connected to the prober and adapted for active voltage compensation; and a voltage measuring unit connected to the controller and for measuring a voltage on the substrate.

In one embodiment, an apparatus for testing or processing electronic elements on a substrate is provided. The apparatus includes: a chamber for having the substrate disposed therein; a substrate support for supporting the substrate; a prober for contacting the substrate when disposed on the substrate support; and a holder adapted for holding a voltage measuring unit, the voltage measuring unit being adapted for measuring a voltage on the substrate In another embodiment, a method active voltage compensation in a chamber having a substrate support for supporting a substrate with electronic elements, and a prober for contacting the electronic elements is provided. The method includes: loading the substrate in the chamber, wherein the substrate and the substrate support are positioned distant from each other at a predetermined distance before the substrate and the substrate support approach each other; disposing the substrate on the substrate support in a supporting position; contacting the electronic elements with the prober; testing or processing the substrate; providing a compensation voltage to the electronic elements; breaking the contact of the prober and the electronic elements; and moving at least one of the substrate and the substrate support to increase the distance of the substrate and the substrate support after the compensation voltage is provided.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4 shows a schematic illustration of a test system according to embodiments described herein.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

As describe herein the term electronic device or electronic elements refers to electrodes, connections, TFTs, displays, on or more electrically conductive layers or the like, which are provided on a substrate, for example, a glass substrate. Such electronic devices or elements can be used for flat panel displays like LCD displays, OLED displays or plasma displays.

Embodiments described herein can be used for a variety of test applications. For simplicity, in the following, it is referred to testing of displays with an electron beam. However, other test apparatuses and test methods, e.g., with a light optical beam, may also utilize embodiments described herein. According to yet further embodiments, which can be combined with other embodiments described herein, active voltage compensation can also be applied for PVD or CVD processing tools or other ESD critical applications, wherein a substrate is moved to and from a substrate support.

As a further example, embodiments described herein can be incorporated in or conducted on AKT EBT test tools, such as EBT 15k, 15ks, 25k, 40k or 55k.

The term substrate as used herein refers generally to large area substrates made of glass, a polymeric material, or other substrate materials suitable for having an electronic device formed thereon. Embodiments depicted in this application refer to various drives, motors and actuators that may be one or a combination of the following: a pneumatic cylinder, a hydraulic cylinder, a magnetic drive, a stepper or servo motor, a screw type actuator, or other type of motion device that provides vertical movement, horizontal movement, combinations thereof, or other device suitable for providing at least a portion of the described motion.

Various components described herein may be capable of independent movement in horizontal and vertical planes. Vertical is defined as movement orthogonal to a horizontal plane and will be referred to as the Z direction. Horizontal is defined as movement orthogonal to a vertical plane and will be referred to as the X or Y direction, the X direction being movement orthogonal to the Y direction, and vice-versa. The X, Y, and Z directions will be further defined with directional insets included as needed in the figures to aid the reader. Thereby, it is to be understood that the coordinate systems are used for easier reference and that other coordinate systems, which are non-orthogonal, or which slightly deviate from an orthogonal coordinate system in light of manufacturing inaccuracies or the like, may still be provided for embodiments according to the invention.

Figure 1:
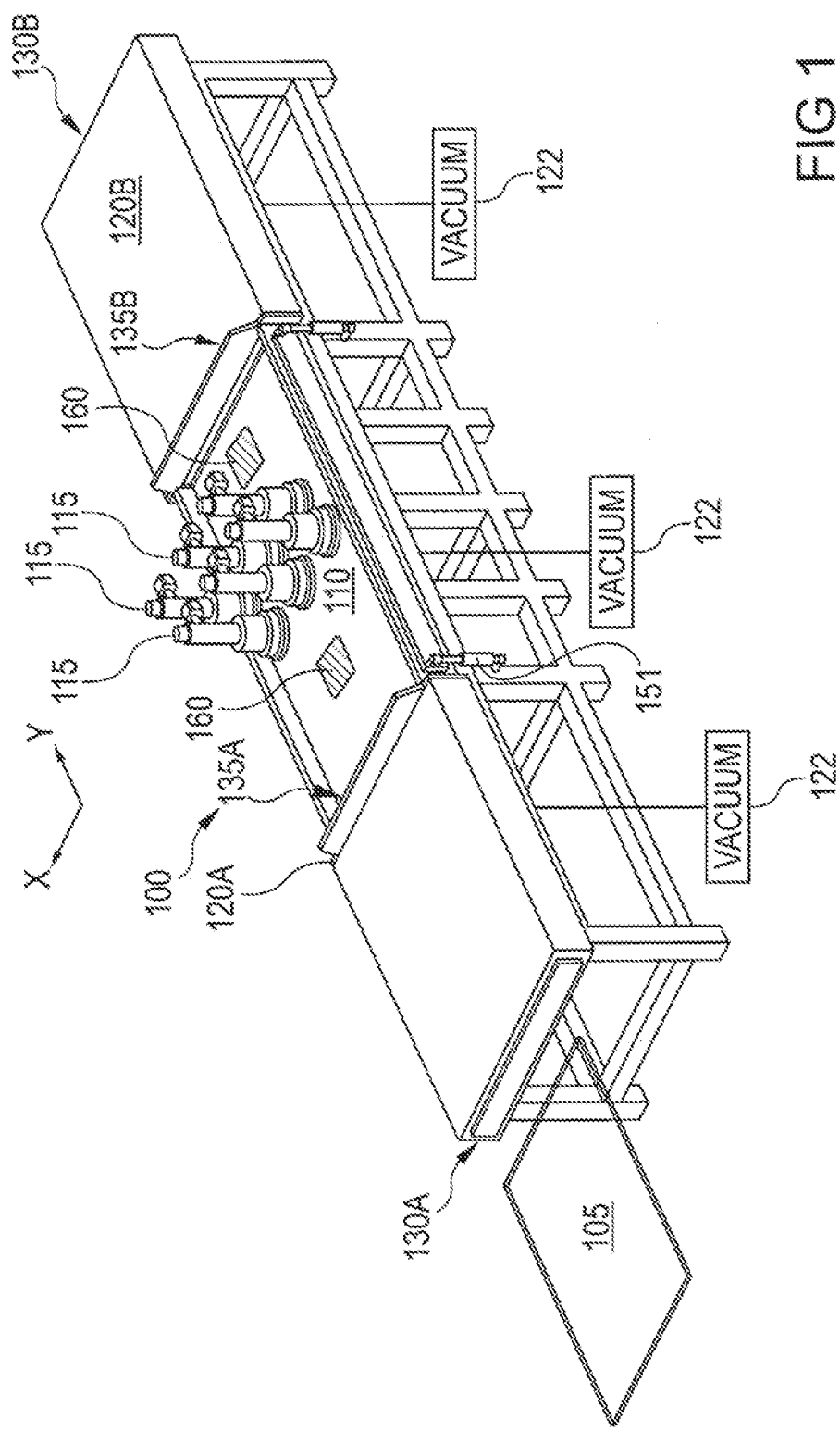
FIG. 1 shows a test system for which embodiments described herein can be used.

FIG. 1 illustrates embodiments of a test system 100, e.g. an in-line test system, adapted to test various properties, such as the operability of electronic devices located on large area flat panel substrates. For example, the large area substrates can have dimensions up to and exceeding about 1920 mm by about 2250, for example for present generation G8.5 2200 mm by 2500 mm, and larger. The test system 100 includes a testing chamber 110, one or more load lock chambers 120A, 120B and a plurality of testing columns 115 (six are shown in FIG. 1). According to different embodiments, the one or more testing columns, can be charged particle beam columns such as electron beam columns, light optical columns including a light modulator based on capacitive coupling or any device adapted to test electronic devices located on large area substrates. Thereby, the electronic devices can be thin film transistors (TFTs), electrodes, connection to electrodes. According to different embodiments, which can be combined with other embodiments described herein, the electronic devices provide or carry a charge corresponding to a pixel or sub-pixel of a flat panel display. The test system 100 is typically located in a clean room environment and may be part of a manufacturing system that includes substrate handling equipment such as robotic equipment or a conveyor system that transports one or more large area substrates to and from the testing system 100.

The one or more load lock chambers 120A may be disposed adjacent and connected to the testing chamber 110 on one side, or on both sides of the testing chamber 110 by a valve 135A disposed between load lock chamber 120A and the testing chamber 110, and a valve 135B disposed between load lock chamber 120B and the testing chamber 110. The load lock chambers 120A, 120B facilitate transfer of large area substrates to and from the testing chamber 110 and ambient environment from a transfer robot and/or a conveyor system typically located in the clean room environment. In one embodiment, the one or more load lock chambers 120A, 120B may be a dual slot load lock chamber configured to facilitate transfer of at least two large area substrates. Examples of a dual slot load lock chamber are described in U.S. Pat. No. 6,833,717, which issued Dec. 21, 2004, and U.S. patent application Ser. No. 11/298,648, entitled "Substrate Support with Integrated Prober Drive," filed Jun. 6, 2005, both of which are incorporated herein by reference to the extent the applications are not inconsistent with this disclosure.

According to some embodiments, the load lock chamber 120A can be adapted to receive the substrate from the clean room environment through an entry port 130A, while the load lock chamber 120B has an exit port 130B that selectively opens to return the large area substrate to the clean room environment. According to yet other embodiments, one or more load lock chamber can be provided, wherein each load lock chamber is adapted for loading and unloading a substrate. The load lock chambers 120A, 120B are sealable from ambient environment and are typically coupled to one or more vacuum pumps 122, and the testing chamber 110 may be coupled to one or more vacuum pumps 122 that are separate from the vacuum pumps of the load lock chambers 120A, 120B. An example of various components of an electron beam test system for testing large area substrates are described in U.S. Pat. No. 6,833,717, which issued Dec. 21, 2004, entitled "Electron Beam Test System with Integrated Substrate Transfer Module," previously incorporated by reference. Thereby, according to typical embodiments, which can be combined with other embodiments described herein, after the load lock chamber and the test chamber have been evacuated to a similar pressure, a valve such as a slit valve between the chambers is opened and an end effector connected to a robot moves from the test chamber into the load lock chamber, lifts the substrate and retracts into the test chamber while carrying the substrate. The substrate can then be positioned above or on a substrate support structure in the test chamber 110 as will be described in more detail below.

According to yet further embodiments, which can be combined with other embodiments described herein, the load lock chamber and/or the test chamber may have a microscope for inspecting portions of the substrate in the load lock chamber and/or the test chamber. Examples of a microscope are described in U.S. patent application Ser. No. 11/375,625 (US 2006/0244467), entitled "In-Line Electron Beam Test System", filed Mar. 14, 2006, which is incorporated herein by reference to the extent the applications are not inconsistent with this disclosure.

According to some embodiments, the test system 100 is configured to transport a large area substrate 105 having electronic devices located thereon through a testing sequence along a single directional axis, shown in the figure as the Y axis. In other embodiments, the testing sequence may include a combination of movement along the X and Y axis. In other embodiments, the testing sequence may include Z directional movement provided by one or both of the testing columns 115 and a movable substrate support within the testing chamber 110. The substrate 105 may be introduced into the test system 100 along either the substrate width or substrate length. The Y directional movement of the substrate 105 in the test system allows the system dimensions to be slightly larger than the width or length dimensions of the substrate 105.

According to some embodiments, which can be combined with other embodiments described herein, one or more voltage measurement units 160 can be provided in a test system, as shown in FIG. 1. Thereby, according to some embodiments, the voltage measurement unit is adapted for measuring an absolute value of the voltage of the substrate in the test system, i.e., the potential of the substrate with regard to ground. The voltage measuring unit 160 can be used to measure the electrical potential on the substrate during different processing steps. This will be explained in more detail with respect to FIGS. 3A to 6.

The test system 100 may also include a movable substrate support table configured to move in at least a Y direction through the test system 100. Alternatively, the substrate 105, with or without a support table, may be transferred through the test system by a conveyor, a belt system, a shuttle system, or other suitable conveyance adapted to transport the substrate 105 through the test system 100. In one embodiment, any of these support and/or transfer mechanisms are configured to only move along one horizontal directional axis. The chamber height of the load locks 120A, 120B, and the testing chamber 110 can be minimized as a result of the unidirectional transport system. The reduced height combined with the minimal width of the testing system provides a smaller volume in the load locks 120A, 120B, and the testing chamber 110. This reduced volume decreases pump-down and vent time in the load lock chambers 120A, 120B, and the testing chamber 110, thereby enhancing throughput of the test system 100. The movement of the support table along a single directional axis may also eliminate or minimize the drives required to move the support table in the X direction.

According to embodiments described herein, the substrate is provided above a support structure, the substrate and the support structure are brought into contact for support of the substrate during testing, and the substrate and the support structure are separated again before the substrate is transferred to a transfer chamber, such as a load lock chamber after testing. Thereby, according to different embodiments, which can be combined with other embodiments described herein, the support structure can be a support and transfer structure, wherein the support structure also transfers the substrate during testing. According to yet further alternative modifications, the substrate and the support structure can be brought in contact by moving the substrate and/or by moving the support structure. For example, the substrate can be transferred in the test chamber and over the support structure. Then the support structure is lifted to support the substrate. Alternatively or additionally, after the substrate has been transferred in the test chamber and over the support structure, the substrate is lowered on the support structure.

Figure 2:
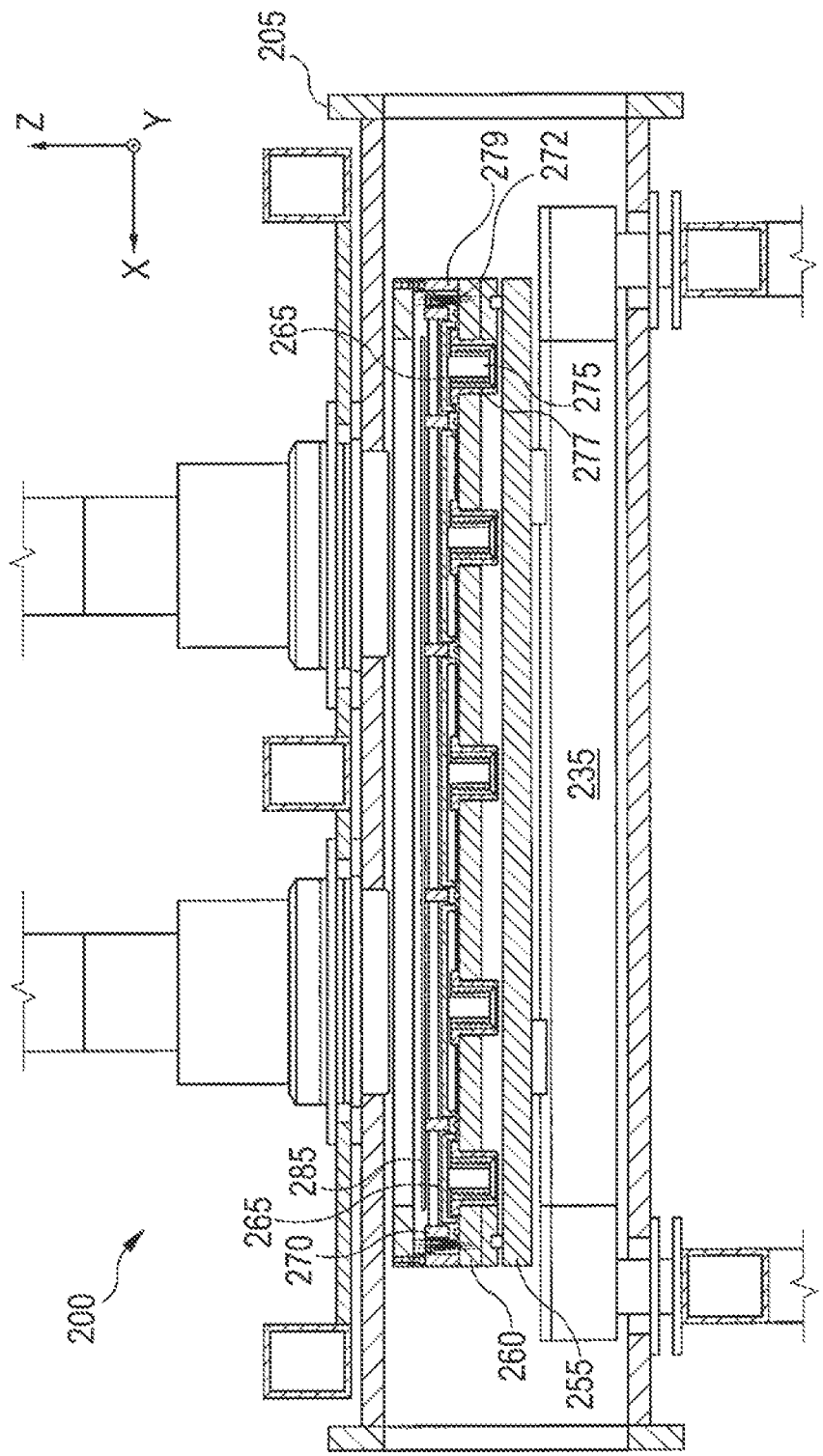
FIG. 2 shows a more detailed view of a test system, which can be used with embodiments as described herein.

According to some embodiments, which can be combined with other embodiments described herein, a substrate structure or support table can be provided as shown in FIG. 2 in more detail. FIG. 2 shows an enlarged cross section view of the testing chamber 200. The substrate table includes a first stage 255, a second stage 260, and third stage 265. The three stages 255, 260, and 265 are planar monoliths or substantially planar monoliths, and are stacked on one another. In one aspect, each of the three stages 255, 260, 265 move independently along orthogonal axes or dimensions. For simplicity and ease of description, the first stage 255 will be further described below as representing the stage that moves along the X-axis and will be referred to as the lower stage 255. The second stage 260 will be further described below as representing the stage that moves along the Y-axis and will be referred to as the upper stage 260. The third stage 265 will be further described below as representing the stage that moves along the Z-axis and will be referred to as the Z-stage 265.

The lower stage 255 and the upper stage 260 each may move side to side or forward and backward, depending on the orientation of the testing chamber 200. In other words, the lower stage 255 and the upper stage 260 both move linearly on the same horizontal plane, but move in a direction orthogonal to one another. In contrast, the Z-stage 265 moves in a vertical direction or the "Z direction." For example, the lower stage 255 moves side to side in the "X direction", the upper stage 260 moves forward and backward in the "Y direction" and the Z-stage 265 moves up and down in the "Z direction."

The lower stage 255 is coupled to the base 235 through a first drive system (not shown in this view). The first drive system moves the lower stage 255 linearly along the X axis. Similarly, the upper stage 260 is coupled to the lower stage 255 through a second drive system, (not shown in this view) which moves the upper stage 260 linearly along the Y axis. The first drive system is capable of moving the substrate table 250 in the X direction or dimension by at least 50 percent of the width of the substrate. Likewise, the second drive system is capable of moving the substrate table 250 in the Y direction or dimension by at least 50 percent of the length of the substrate. Examples of various components of the drive systems are described in U.S. Pat. No. 6,833,717, which issued Dec. 21, 2004, entitled "Electron Beam Test System with Integrated Substrate Transfer Module," which is incorporated herein by reference to the extent the applications are not inconsistent with this disclosure.

As shown in FIG. 2, the testing chamber 200 further includes an end effector 270, which may be provided as a lift fork, to transfer a substrate 285 in and out of the testing chamber 200. In operation, the end effector 270 may be extended from the testing chamber 200 into the load lock chamber 120 to load a substrate. Likewise, the end effector 270 having a substrate loaded thereon may be extended from the testing chamber 200 into the load lock chamber 120 to transfer the substrate to the load lock chamber 120. A motion device, such as a linear actuator, a pneumatic cylinder, a hydraulic cylinder, a magnetic drive, or a stepper or servo motor, for example may be coupled to the end effector 270 to assist this transfer. In one aspect, the end effector 270 includes a pair of bearing blocks 272 that permit the end effector 270 to move in and out of the testing chamber 200.

FIG. 2 shows one embodiment of the end effector 270 having four fingers that are evenly spaced, which contact and support the substrate 285 when placed thereon. The actual number of fingers is a matter of design and is well within the skill of one in the art to determine the appropriate number of fingers needed for the size of substrate to be manipulated.

The Z-stage 265 is disposed on an upper surface of the upper stage 260. The Z-stage 265 has a planar or substantially planar upper surface to contact and support the substrate 285 within the testing chamber 200. The Z-stage 265 is slotted or segmented such that each segment of the Z-stage 265 sits adjacent the fingers of the end effector 270. As such the Z-stage 265 and the end effector 270 can be interdigitated on the same horizontal plane. This configuration allows the Z-stage 265 to move above and below the end effector 270. Accordingly, the spacing between the segments of the Z-stage 265 corresponds to the width of the fingers of the end effector 270 plus some additional measure to assure clearance. Although five segments are shown in the cross section view of FIG. 2, the Z-stage may have any number of segments.

According to different embodiments, which can be combined with other embodiments described herein, one or more Z-stage lifts 275 is coupled to the back side of each of the segments making up the Z-stage 265. Each Z-stage lift 275 is disposed within a channel formed in the upper stage 260, and a bellows 277 is arranged about each Z-stage lift 275 to reduce particle contamination within the testing chamber 200. The Z-stage lift 275 moves up and down vertically and may be actuated pneumatically or electrically. The bellows 277 compress and expand in response to the movement of the lift 275.

Figure 3A:
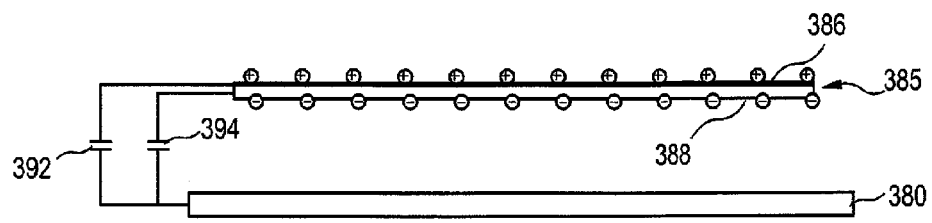
FIGS. 3A to 3C illustrate the use of an apparatus for testing or test system and a method of testing a substrate for illustrating the charge on a substrate during testing a substrate.
Figure 3B:
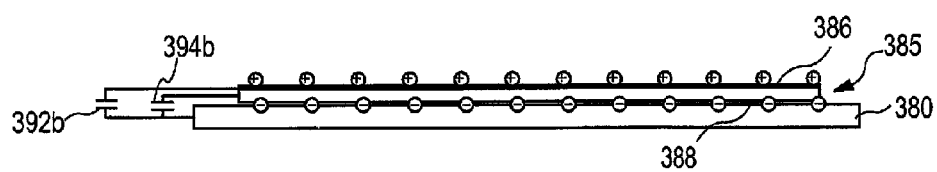
Figure 3C:
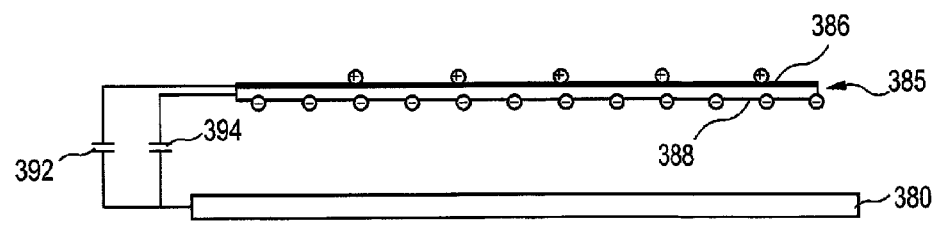

As described above, within a test system a substrate is loaded in a test chamber. Thereby, the substrate can be lowered on the substrate support such as a stage, a substrate table, or the like. Alternatively, the substrate support or the table can be lifted to support the substrate. According to a yet a further embodiment, the movement of the substrate and the substrate support can be combined. FIG. 3a shows a scenario for which the substrate 385 is distant from the substrate support structure 380. During testing, as shown in FIG. 3b., the substrate 385 is supported by the substrate support 380 such that the substrate is in contact with portions of the substrate support, or floats slightly above the substrate support, e.g., on an air cushion. After the test procedure, in order to unload the substrate from the test chamber, the substrate 385 and the substrate support structure 380 are moved apart from each other in vertical direction (z-direction). Thereby, during handling of the substrate excessive voltages may occur and destroy electronic elements of the display or the entire display. Especially when the substrate is lifted off the stage, voltages up to several thousands of volts may occur. This is illustrated in FIG. 3C by the reduced number of positive charge on the substrate. This phenomenon may occur especially based on the fact that it is common practice to ground the substrate after the testing has been conducted in the test chamber.

The above-described electrostatic charge (ESC) may be influenced by a plurality of factors such as the initial charge on the substrate and the polarization thereof. Thereby, a process dependent charge may be present before testing of the substrate. Further, an additional charge might be brought on the substrate by a triboelectric effect. Further a capacitive coupling between the substrate and adjacent components may occur dependent on the test system geometry and the materials used for the testing system. The electrostatic charge can, thus, vary based on past and present process steps conducted on the substrate, and is difficult to be influenced. Accordingly, in light thereof, the ESC may occur as follows: If a polarized substrate having, e.g. a glass portion 388 and upper surface 386, such as pixel electrodes or other conducting parts, comes to the substrate support, i.e. a stage, in a lifted position, the capacitance 392 of the glass top and the capacitance 394 of the glass bottom are almost the same and no static voltage, or just a small non destructive static voltage would be measured on the substrate or the upper surface 386, respectively having the electronic devices thereon. This is shown in FIG. 3A. According to some embodiments, which can be combined with embodiments of the invention described herein, the distance of the substrate 385 and the substrate support 380 might be about 15 mm in the lifted position.

During placement of the substrate 385 on the substrate support 380, as shown in FIG. 3B, the bottom surface of the substrate, e.g., the glass, is close to the substrate support while the upper surface 386 having the electronic devices is separated from the substrate support by the layer 388. Accordingly, the capacitance $394b$ is larger than the capacitance $392b$. As a result, the voltages do not compensate each other and a static voltage can be detected.

During testing, as described above, a prober bar or prober frame contacts the electronic elements on the substrate and is commonly grounded after the test procedure. Thereby, the electronic elements, i.e., the display is forced to ground potential, which causes an inflow or drain of charge carriers depending on the substrate pre-condition. Then the prober bar disconnects from the substrate and the charged (number of charge carriers) stays constant.

In the subsequent lifted position for unloading the substrate, see FIG. 3C, the substrate is brought into a distance from the substrate support such that the capacitances 392 and 394 are almost equal again and significantly smaller than during the previous condition - the placement of the substrate 385 on the substrate support 380, as shown in FIG. 3B. Thereby, constant charged and significantly reduced capacity can cause the voltage on the upper surface 386 including the electronic elements, the display, the electrodes, or the like, to rise to several thousands of volts, which may destroy the electronic elements.

Figure 5A:
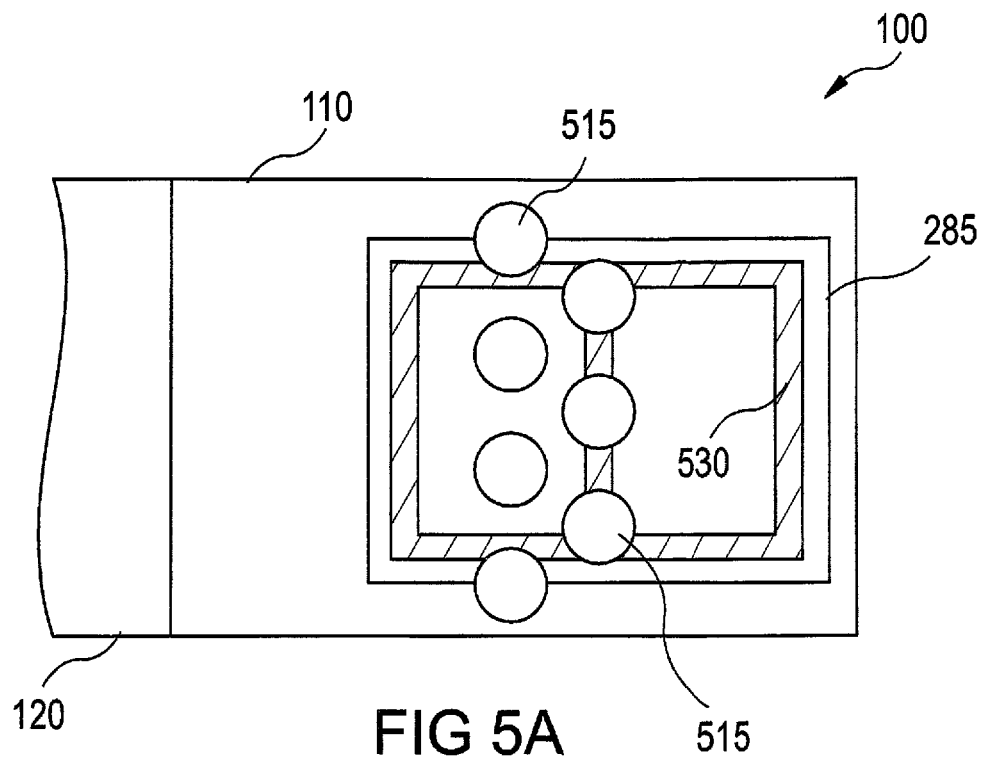
FIGS. 5A and 5B show an apparatus for testing according to embodiments described herein and illustrate methods of testing a substrate according to embodiments described herein.
Figure 5B:
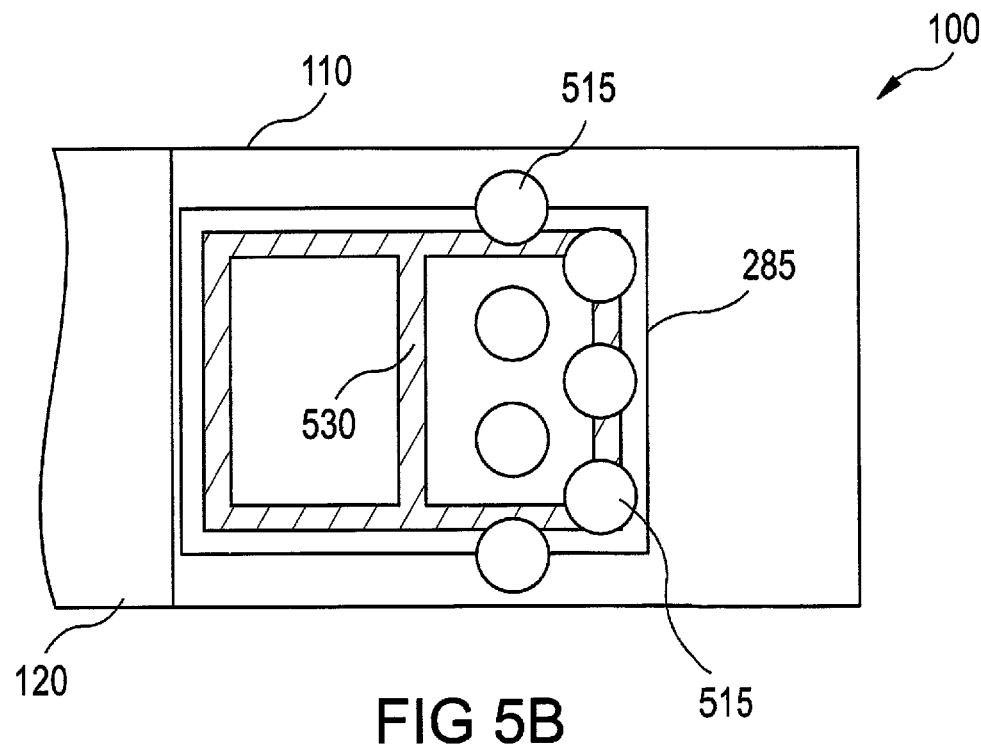
Figure 6:
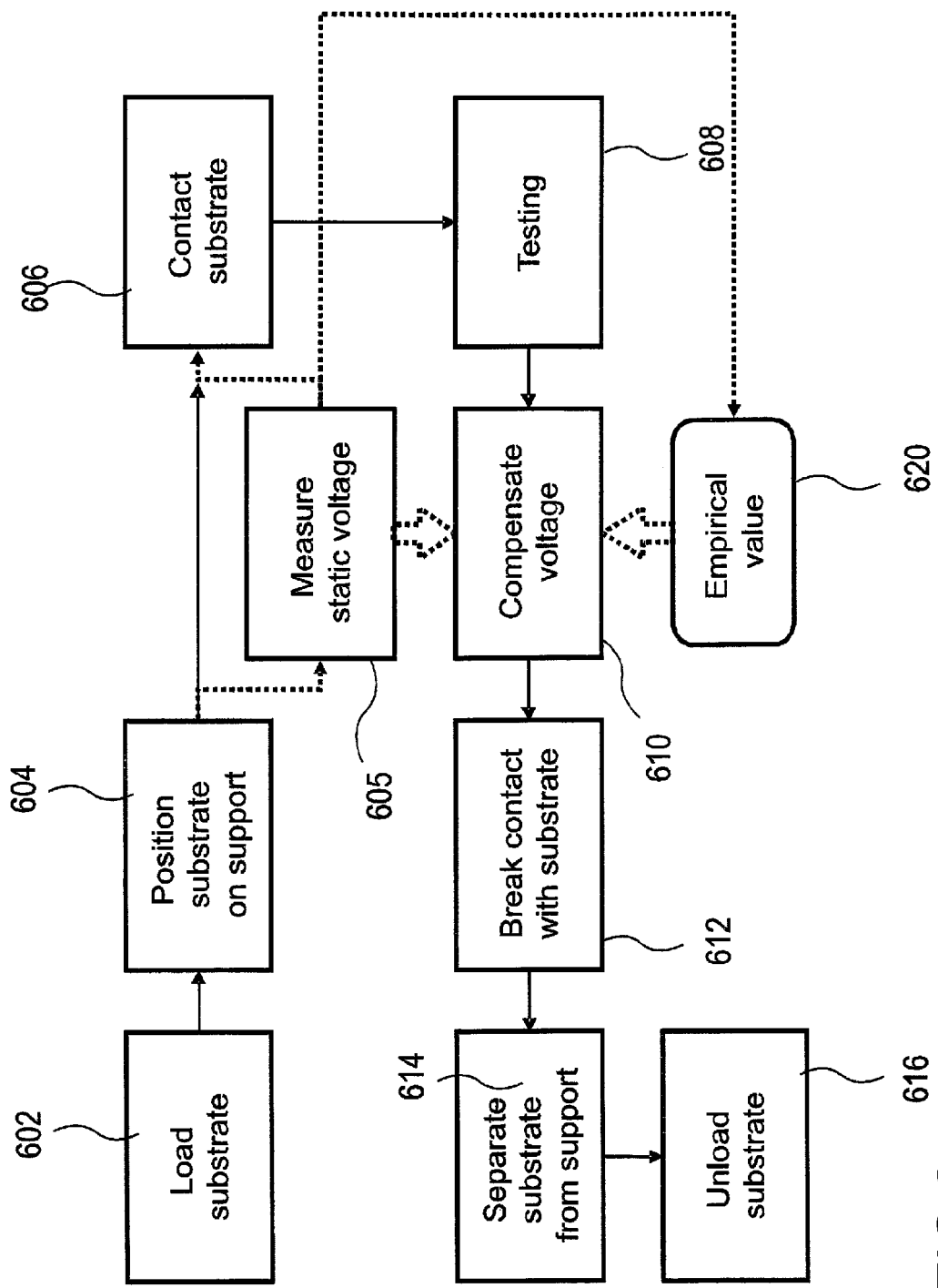
FIG. 6 is a flow chart illustrating methods of active voltage compensation according to embodiments described herein and which can be conducted with active voltage compensation assemblies according to embodiments described herein.

In order to increase the throughput of the system by reducing or avoiding that the electronic devices are destroyed, embodiments of the present invention can provide a charged compensation as described with respect to FIGS. 4 to 6. FIG. 4 shows a schematic diagram of a test system including a load lock chamber load lock chamber 120 and a test chamber 110. According to some embodiments, one or more of the following elements may be provided: one or more test columns 515, a prober bar 430 having prober heads 432 for contacting the electronic elements on the substrate attached thereto. According to some embodiments, which can be combined with other embodiments described herein, the prober heads can be attached to the prober bar 430 such that they are movable in order to allow for an alignment of the contact positions for different substrate designs. According to yet further alternative or additional modifications, a prober frame with variable contact position, e.g., via re-positionable prober heads, adjustable frame bar positions, or the like, can be provided.

According to yet further embodiments, which can be combined with other embodiments described herein, a voltage measuring unit 460 can be provided. Typically, according to different embodiments, the voltage measurement unit can be adapted to measure an absolute value of the voltage on a substrate, e.g., the voltage measuring unit can be a static voltmeter. According to specific optional implementations, the voltage measuring unit is adapted for measuring a static voltage and/or can be adapted to measure an electric flux line. For example, an oscillating piezo-crystal can be used for measuring electric flux lines and, thereby, absolute voltage on the substrate.

According to yet further embodiments, which can be combined with other embodiments described herein, the voltage measuring unit 460 may be fixedly installed in the test system or the voltage measuring unit 460 may be removably installed in the test system, such that the voltage measuring unit can be used during installation of the test system and/or when a new product having a different process history and, thus, a different initial electrostatic charge, is used in the test system for the first time. According to yet further additional or alternative modifications, the voltage measuring unit may be installed within the test chamber or within the housing of the test chamber. According to yet further modifications, on or more voltage measuring units may be provided, which may for example, depend on the number of load lock chambers provided. For example, as shown in FIG. 1, if two load lock chambers are provided on each side of the test chamber, two voltage measuring units may be provided for measuring the static voltage on the substrate after loading and before unloading of the substrate.

A test system 100, as for example shown in FIG. 4, can be used to apply the following methods. According to one embodiment, a substrate enters the test chamber in a lifted position, e.g., about 5 to 25 mm, typically 12 to 18 mm above the substrate support or stage and the voltage measuring unit, e.g., an electrostatic voltmeter senses the initial voltage $V_0$. This voltage $V_0$ may, for example, be in the range of 50 V to 150 V. The substrate is lowered on the substrate support and/or the substrate support is lifted up in order to have the substrate being supported by the substrate support. The voltage measuring unit measures the static voltage on the substrate to obtain a value $V_1$. For example, a value $V_1$ of 50 V or 60 V may be measured. According to yet further embodiments, typical absolute values for a compensation voltage can be 50 V or below, such as 20 V to 40 V The prober contacts the electronic elements on the substrate during testing and, for example, grounds the displays such that a voltage of 0 V is measured or provides a testing voltage to one or more of the electronic elements. After testing, before the prober is lifted from the substrate, i.e., as long as the prober has contact to the substrate, the voltage on the substrate is set to the voltage value $V_1$. For example, all prober pins are set to the previously measured voltage $V_1$ for all displays on the substrate. The substrate is separated from the support by movement of the substrate and/or the support for unloading of the substrate, and at a distance similar to the loading condition a similar static voltage present as the initial static voltage.

After the substrate has been lifted from the substrate support a voltage $V_2$ is provided on the upper surface of the substrate. If the compensation voltage is set to equal $V_1$, the voltage $V_2$ is similar to the ignition voltage $V_0$.

Generally, according to different embodiments described herein a voltage compensation assembly can be adapted for a closed loop control, i.e., including a controller for a closed loop control and/or a method of voltage compensation can be conducted with a closed loop control. According to one option, the voltage $V_1$ in the supporting position can be measured and a controller provides a voltage with a value of the voltage $V_1$ to all prober needles before the prober is separated from the substrate. According to another option, the voltage $V_2$ can be measured after the substrate has been lifted from the substrate support and the measured voltage $V_2$ can be used as a reference value to feed forward the value to the closed loop control in order to adjust the compensation voltage to minimize $V_2$ within the process.

According to yet further embodiments, the active voltage compensation can be conducted without closed loop control. For example, the desired compensation voltage is measured manually or predetermined by other means like a knowledge database. The corresponding compensation voltage is used as an input parameter for a control software and is applied to all prober needles before the prober is lifted from the substrate. According to an even further embodiment, the voltage can be set by experiment to a value in a manufacturing line such that within the manufacturing line the compensation voltage results in an voltage $V_2$, which is smaller than a threshold value, e.g., manufacturing specification such as smaller than +−150 V. Thereby, if no closed loop control is provided, care has to be taken that the sign and value of the compensation voltage can differ depending on the tested or processed product and the present and past process parameters.

As described above, according to embodiments described herein, for processes creating electrostatic discharge (ESD) the ESD can be reduced by contacting the electronic devices and providing a defined charge to counteract the ESD. Thereby, the defined charge can be predetermined in the case the process parameters during testing and during previous processing steps are sufficiently known, or the charge to be applied can be measured with a voltage measuring unit.

Accordingly, an active voltage compensation can be provided for embodiments described herein. According to some embodiments, the active voltage compensation can be conducted by control of a control unit 470. As illustrated in FIG. 4, the control can be conducted with a closed loop system. For example, after loading the substrate in the test chamber 110 from the load lock chamber 120, the substrate 285 can be transported to the end of the test chamber 110, the right hand side in FIG. 4, and is moved, as indicated by arrow 402, for testing. After a portion of the substrate 285 has been tested by test columns 515 and while the probe heads 432 are still in contact with the electronic elements to be tested the voltage measuring unit 460 measures the voltage of the portion on the substrate. The measured value can be provided to the control unit 470, which is in communication with the probe heads 432 and provides a signal to the probe heads 432 in order to actively compensate the voltage on the substrate with a desired value by providing a voltage to the contact pins of the probe heads 432. Thereafter the probe heads can be lifted off from the substrate and positioned on the next portion of the substrate. Thus, according to some embodiments, which can be combined with other embodiments described herein, the active voltage compensation can be conducted portion by portion, particularly if a prober is contacting not the entire substrate at one time.

As described above, according to embodiments described herein, which can be combined with other embodiments, a closed loop control can be provided. The closed loop control can, thereby, include measuring the static voltage on the substrate with the voltage measuring unit 460, feeding the result to a control unit 470, and controlling the voltages provided to the electronic elements on the substrate via contact pins of probe heads, probe frames, or the like by the control unit 470.

As shown in FIG. 4, the control unit 470 may also include a memory 475. According to further modifications, the memory 475 can be used to store values of a desired voltage for active voltage compensation. Thereby, a measurement of the static voltage can be omitted for those cases, for which all process parameters, for example, past and present parameters in the substrates processing history, are predetermined and the value for an active voltage compensation can be defined as a predetermined value.

Corresponding embodiments are, for example, shown in FIGS. 5A and 5B. FIG. 5A shows a situation wherein the substrate 285 has been loaded from the load lock chamber 120 in the test chamber 110, a prober head or prober frame 530 has been placed on the substrate 285, the substrate has moved to one side of the test chamber 110 and testing of the substrate is conducted with the test columns 515 is conducted while the substrate moves from one side of the test chamber to the other side of the test chamber, from right to left in FIGS. 5A and 5B. FIG. 5B shows the end of the test preceding wherein the last portion of the substrate 285 has been tested and the test frame 530 is still in contact with the substrate 285. Before lifting off the prober frame 530 from the substrate, a predetermined voltage for active voltage compensation of the ESD is provided to the electronic elements, such as all displays on the substrate. Thereafter, the contact of the prober 530 with the substrate 285 can be broken and the substrate 285 can be lifted off from the substrate support without damaging the substrate by occurrence of excessively high voltages on the electronic devices on the substrate.

These and other embodiments can be illustrated by the flowchart shown in FIG. 6. Generally, a test procedure in a test system can be conducted as follows. The substrate having the electronic devices, such as displays, TFTs of displays, electrode of displays, or the like provided thereon is loaded in a test chamber (step 602). In step 604, the substrate is positioned on the substrate support such as a stage or a table. This can be done by the vertical movement of the substrate, vertical movement of the support or combination thereof. It will be understood by a skilled person that vertical movement refers, for example, to a horizontally oriented substrate above the substrate support. In case of other substrate orientations or support mechanisms, the movement between the substrate and the substrate support may not be vertical but correspondingly provided in another direction in order to have a substrate supported by the substrate support.

For testing procedures such as e-beam testing, testing with light optical beams or other testing procedures, generally the substrate, i.e. the electronic elements on the substrate are contacted by a prober (step 606). Thereafter the testing procedure can be conducted in step 608. Before the contact between the prober and the substrate is released, in step 612, active voltage compensation is conducted via the prober being in contact with substrate. Thereafter the substrate can be separated from the substrate support in step 614 and the substrate can be unloaded from the test chamber in step 616.

According to further embodiments, which can be combined with other embodiments described herein, a measurement of the static voltage on the substrate can be conducted in step 605 after the substrate has been positioned on the substrate support. According to yet further alternative or additional modifications, a static voltage measurement may also be conducted after the substrate has been loaded in the test chamber and before the substrate is positioned on the substrate support, i.e. as long as the substrate is distant from the substrate support. Such a measurement can provide information with respect to the voltage difference before and after the distance from the substrate to the substrate support has been changed. Typically, according to some embodiments, the static voltage measurement 605 can be used to compensate the voltage in step 610. Thereby, the static measured voltage after the substrate has been positioned on the support can be provided during active voltage compensation before the substrate is lifted off from the support.

According to yet further embodiments, which can be combined with other embodiments described herein, the static voltage measurement in step 605 can be used to provide a predetermined value or empirical value in step 620. Thereby, for example one or more substrates within a constant process flow can be measured in step 605, the value thereof or a mean value thereof can be stored as a predetermined value, and the predetermined value can be used in step 610 for active voltage compensation without the necessity to always measure the static voltage in step 605. Thus, according to different embodiments, a voltage measurement unit for measuring up stage voltage, such as a voltmeter, can be fixedly installed in a test chamber or may be re-movably installed in a test chamber.

In light of the above, embodiments described herein can be combined with each other to yield yet further embodiments. For example, according to one embodiment a voltage compensation assembly adapted for a test system for electronic elements on a substrate, the test system having a prober for contacting the electronic elements on a substrate is provided. The voltage compensation units include: a controller connected to the prober and adapted for active voltage compensation; and a voltage measuring unit connected to the controller and for measuring a voltage on the substrate. According to optional modification thereof, the voltage measuring unit can be adapted for measuring an absolute value of a static voltage; the voltage measuring unit can be a static voltmeter; and/or the voltage measuring unit can include an oscillating piezocrystal measuring electronic field flux lines for measuring the voltage of the substrate.

According to a yet further embodiment, an apparatus for testing electronic elements on a substrate is provided. The apparatus includes a test chamber for having the substrate disposed therein; a substrate support for supporting the substrate; a prober for contacting the substrate when disposed on the substrate support; one or more test columns for testing the electronic elements on the substrate; and a holder adapted for holding a voltage measuring unit, the voltage measuring unit being adapted for measuring a voltage on the substrate. According to optional modifications thereof the apparatus can include a voltage compensation assembly according to any of the embodiments described herein, particularly such that the holder is adapted to hold the voltage measuring unit. According to yet further alternative or additional implementations, the one or more test columns are electron beam test systems or the one or more test columns are light optical test systems including an optical modulator which capacitively couples to the electronic elements; and/or the prober may comprise at least one element selected from the group consisting of: a prober bar, a prober frame, and a prober head.

According to yet other embodiments a method for active voltage compensation in a test chamber having a substrate support for support a substrate with electronic elements, and a prober for contacting the electronic elements is provided. The method includes loading the substrate in the test chamber, wherein the substrate and the substrate support are positioned distant from each other at a predetermined distance before the substrate and the substrate support approach each other; disposing the substrate in the substrate support in a supporting position; contacting the electronic elements with the prober; testing the substrate; providing a compensation voltage to the electronic elements; breaking the contact of the prober and the electronic elements; and moving at least one of the substrate and the substrate support to increase the distance of the substrate and the substrate support after the compensation voltage is provided. According to further optional modifications, a method may further include measuring a static voltage in the supporting position and providing the compensation voltage to be in a range of the static voltage +−10%; measuring a further static voltage in the position of the predetermined voltage; and/or measuring a further static voltage in the position of the predetermined voltage. According to yet further embodiments, which can be combined with other embodiments described herein, the compensation voltage can be provided as the voltage from a memory as a predetermined voltage and/or the compensation voltage can be in a range from −10V to −100V or from 10V to 100V.

While the foregoing is directed to embodiments of the present invention, other and further embodiments of the invention may be devised without departing from the basic scope thereof, and the scope thereof is determined by the claims that follow.

What is claimed is:

1. Method for active voltage compensation in a chamber having a substrate support for support a substrate with electronic elements, and a prober for contacting the electronic elements, the method comprising:
    loading the substrate in the chamber, wherein the substrate and the substrate support are positioned distant from each other at a predetermined distance before the substrate and the substrate support approach each other;
    disposing the substrate on the substrate support in a supporting position;
    contacting the electronic elements with the prober;
    testing or processing the substrate;
    providing a compensation voltage to the electronic elements via the prober;
    breaking the contact of the prober and the electronic elements;
    moving at least one of the substrate and the substrate support to increase the distance of the substrate and the substrate support after the compensation voltage is provided.

2. The method according to claim 1, further comprising:
    measuring a static voltage on the substrate in the supporting position; and
    providing the compensation voltage to be in a range of the static voltage +−10%.

3. The method according to claim 1, further comprising:
    measuring a static voltage on the substrate in the position of the predetermined distance.

4. The method according to claim 1, wherein the compensation voltage is provided as the voltage from a memory as a predetermined voltage.

5. The method according to claim 1, wherein the compensation voltage is in a range from −10V to −100V or from 10V to 100V.

* * * * *